(12) United States Patent
Lue et al.

(10) Patent No.: US 8,022,489 B2
(45) Date of Patent: Sep. 20, 2011

(54) AIR TUNNEL FLOATING GATE MEMORY CELL

(75) Inventors: Hang-Ting Lue, Hsinchu (TW);
Erh-Kun Lai, Hsinchu (TW); Kuang Yeu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 412 days.

(21) Appl. No.: 11/134,155

(22) Filed: May 20, 2005

(65) Prior Publication Data
US 2006/0261402 A1    Nov. 23, 2006

(51) Int. Cl.
*H01L 29/788* (2006.01)
*H01L 27/108* (2006.01)
*H01L 27/11* (2006.01)
*H01L 27/112* (2006.01)

(52) U.S. Cl. ........ 257/410; 257/239; 257/261; 257/314; 257/316; 257/E29.3; 257/E21.422; 257/E21.68; 257/E29.304; 438/211; 438/257; 438/421; 438/593

(58) Field of Classification Search ................... 257/239, 257/261, 314–316, 319–321, 410, 520, E29.129, 257/E29.3, E29.304, E21.179, E21.422, E21.68, 257/E29.42, E21.564, E21.581, 522, E21.573; 438/319, 411, 421, 619, 201, 211, 257, 593
See application file for complete search history.

(56) References Cited

U.S. PATENT DOCUMENTS

| RE35,810 | E | * | 5/1998 | Prall | 438/257 |
| 5,864,160 | A | * | 1/1999 | Buynoski | 257/410 |
| 5,895,246 | A |   | 4/1999 | Lee | |
| 5,990,532 | A | * | 11/1999 | Gardner | 257/410 |
| 6,127,251 | A | * | 10/2000 | Gardener et al. | 438/585 |

(Continued)

FOREIGN PATENT DOCUMENTS

JP    61183969 A    8/1986

OTHER PUBLICATIONS

Zhizheng Liu; and Ma, T.P., "A new programming technique for flash memory devices," VLSI Technology, Systems, and Applications, 1999. International Symposium on Jun. 8-10, 1999, pp. 195-198.*

(Continued)

*Primary Examiner* — Matthew Landau
*Assistant Examiner* — Maliheh Malek
(74) *Attorney, Agent, or Firm* — Stout, Uxa, Buyan & Mullins, LLP

(57) ABSTRACT

An air tunnel floating gate memory cell includes an air tunnel defined over a substrate. A first polysilicon layer (floating gate) is defined over the air tunnel. An oxide layer is disposed over the first polysilicon layer such that the oxide layer caps the first polysilicon layer and defines the sidewalls of the air tunnel. A second polysilicon layer, functioning as a word line, is defined over the oxide layer. A method for making an air tunnel floating gate memory cell is also disclosed. A sacrificial layer is formed over a substrate. A first polysilicon layer is formed over the sacrificial layer. An oxide layer is deposited over the first polysilicon layer such that the oxide layer caps the first polysilicon layer and defines the sidewalls of the sacrificial layer. A hot phosphoric acid ($H_3PO_4$) dip is used to etch away the sacrificial layer to form an air tunnel.

10 Claims, 9 Drawing Sheets

U.S. PATENT DOCUMENTS

| | | | |
|---|---|---|---|
| 6,140,182 A * | 10/2000 | Chen | 438/259 |
| 6,380,068 B2 | 4/2002 | Jeng et al. | |
| 6,426,529 B2 * | 7/2002 | Kobayashi | 257/316 |
| 6,500,711 B1 | 12/2002 | Chang | |
| 6,518,134 B2 * | 2/2003 | Yang et al. | 438/301 |
| 6,548,353 B2 * | 4/2003 | Tseng | 438/257 |
| 6,642,108 B2 * | 11/2003 | Skotnicki et al. | 438/257 |
| 6,724,055 B2 * | 4/2004 | Lichter | 257/410 |
| 6,998,669 B2 * | 2/2006 | Lee et al. | 257/315 |
| 7,105,406 B2 * | 9/2006 | Lutze et al. | 438/257 |
| 7,391,071 B2 * | 6/2008 | Park et al. | 257/296 |
| 7,419,868 B2 * | 9/2008 | Ou et al. | 438/237 |
| 7,491,599 B2 * | 2/2009 | Tsai et al. | 438/237 |
| 2002/0008278 A1 * | 1/2002 | Mori | 257/315 |
| 2002/0036316 A1 * | 3/2002 | Fujio et al. | 257/314 |
| 2002/0114179 A1 * | 8/2002 | Hsu et al. | 365/100 |
| 2003/0003662 A1 * | 1/2003 | Suzuki | 438/264 |
| 2003/0047774 A1 * | 3/2003 | Sugita et al. | 257/314 |
| 2004/0061165 A1 * | 4/2004 | Ding | 257/314 |
| 2005/0045940 A1 * | 3/2005 | Chen et al. | 257/315 |
| 2005/0145923 A1 * | 7/2005 | Chen et al. | 257/315 |
| 2005/0176174 A1 * | 8/2005 | Leedy | 438/107 |
| 2006/0060927 A1 * | 3/2006 | Ozawa et al. | 257/390 |
| 2006/0278915 A1 * | 12/2006 | Lee et al. | 257/315 |
| 2007/0034936 A1 * | 2/2007 | Van Schaijk et al. | 257/315 |
| 2008/0203463 A1 * | 8/2008 | Van Schaijk et al. | 257/320 |

OTHER PUBLICATIONS

Mohapatra, N. R.; Mahapatra, S.; V. Ramgopal Rao, "Study of Degradation in Channel Initiated Secondary Electron Injection Regime," Solid-State Device Research Conference, 2001, Proceeding of the 31st European.*

Zhizheng Liu; and Ma, T.P., A new programming technique for flash memory devices, VLSI Technology, Systems, and Applications, 1999, International Symposium on Jun. 8-10, 1999 pp. 195-198.*

Mohapatra, N.R.; Mahapatra, S.; and V. Ramgopal Rao, Study of Degradation in Channel Initiated Secondary Electron Injection Regime, Solid-State Device Research Conference, 2001, Proceeding of the 31st European.*

Y. Song et al., "Highly Manufacturable 90nm NOR Flash Technology with 0.081 um$^2$ Cell Size," 2003 *Symposium on VLSI Technology Digest of Technical Papers* (2 pages total).

Y. Yim et al., "70nm NAND Flash Technology with 0.025μm$^2$ Cell Size for 4Gb Flash Memory," *IEDM Tech. Dig.* (2003), pp. 819-822.

"Silicon-on-Nothing (SON)—an Innovative Process for Advanced CMOS". Jurczak et al., IEEE Transactions on Electron Devices, vol. 47, No. 11, Nov. 2000.

* cited by examiner

AIR TUNNEL FLOATING GATE MEMORY CELL

BACKGROUND OF THE INVENTION

1. Field of the Invention

The present invention relates generally to a floating gate memory cell, and more particularly, to an air tunnel floating gate memory cell and a method for making such a memory cell.

2. Description of the Related Art

As shown in FIG. 1, a conventional floating gate memory cell 100 includes a substrate 110 with doped source 120 and drain 130. A tunnel oxide layer 140 is situated between a floating gate 150 and the substrate 110. An oxide-nitride-oxide (ONO) stack 160 is disposed over the floating gate 150, and a control gate 170 is formed over the ONO stack 160.

The conventional floating gate memory cell 100 uses the tunnel oxide layer 140 as an insulator layer to preserve the charge stored at the floating gate 150. The thickness of the tunnel oxide layer 140 is usually greater than 7 nm. The tunnel oxide layer 140 also serves as a charge transport media for the program/erase operation of the conventional floating gate memory cell 100. However, after a large number of program/erase cycles, the large quantities of injected charge through the tunnel oxide layer 140 induce severe stress-induced leakage current (SILC), leading to the degradation of the tunnel oxide layer 140. The degradation of the tunnel oxide layer 140 will slow down the program/erase speed and reduce the charge retention ability of the floating gate 150 of the conventional floating gate memory cell 100.

In order to enhance the program/erase speed of the conventional floating gate memory cell 100, a larger electric field can be applied to the conventional floating gate memory cell 100. However, the larger electric field will cause more severe degradation of tunnel oxide layer 140. Therefore, the tunnel oxide layer 140, having a program/erase speed upper bound, limits the performance of the conventional floating gate memory cell 100.

In view of the foregoing, there is a need for an improved floating gate memory cell that will enhance the performance and avoid the problems of a conventional floating gate memory cell.

SUMMARY OF THE INVENTION

Broadly speaking, the present invention fills this need by providing an air tunnel floating gate memory cell. A method for making such an air tunnel floating gate memory cell is also provided.

In accordance with one aspect of the present invention, an air tunnel floating gate memory cell is provided. The air tunnel floating gate memory cell includes an air tunnel situated over a substrate. A first polysilicon layer is defined over the air tunnel, functioning as a floating gate. An oxide layer is disposed over the first polysilicon layer such that the oxide layer caps the polysilicon layer and defines the sidewalls of the air tunnel. A second polysilicon layer is defined over the oxide layer and patterned to form a word line. In one embodiment, the air tunnel has a thickness ranging from about 3 nm to about 10 nm. In another embodiment, the air tunnel is a vacuum tunnel.

In accordance with another aspect of the present invention, a method for making an air tunnel floating gate memory cell is provided. A sacrificial layer is formed over a substrate. A first polysilicon layer is formed over the sacrificial layer, functioning as a floating gate. Next, an oxide layer is formed over the first polysilicon layer such that the oxide layer caps the first polysilicon layer and defines the sidewalls of the sacrificial layer. A second polysilicon layer is formed over the oxide layer and patterned to form a word line. Afterwards, a hot phosphoric acid dip is used to laterally etch away the sacrificial layer to form an air tunnel. In one embodiment, the sacrificial layer is a nitride layer. In another embodiment, the thickness of the sacrificial layer 220 ranges between about 3 nm to about 10 nm.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE EXEMPLARY EMBODIMENTS

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
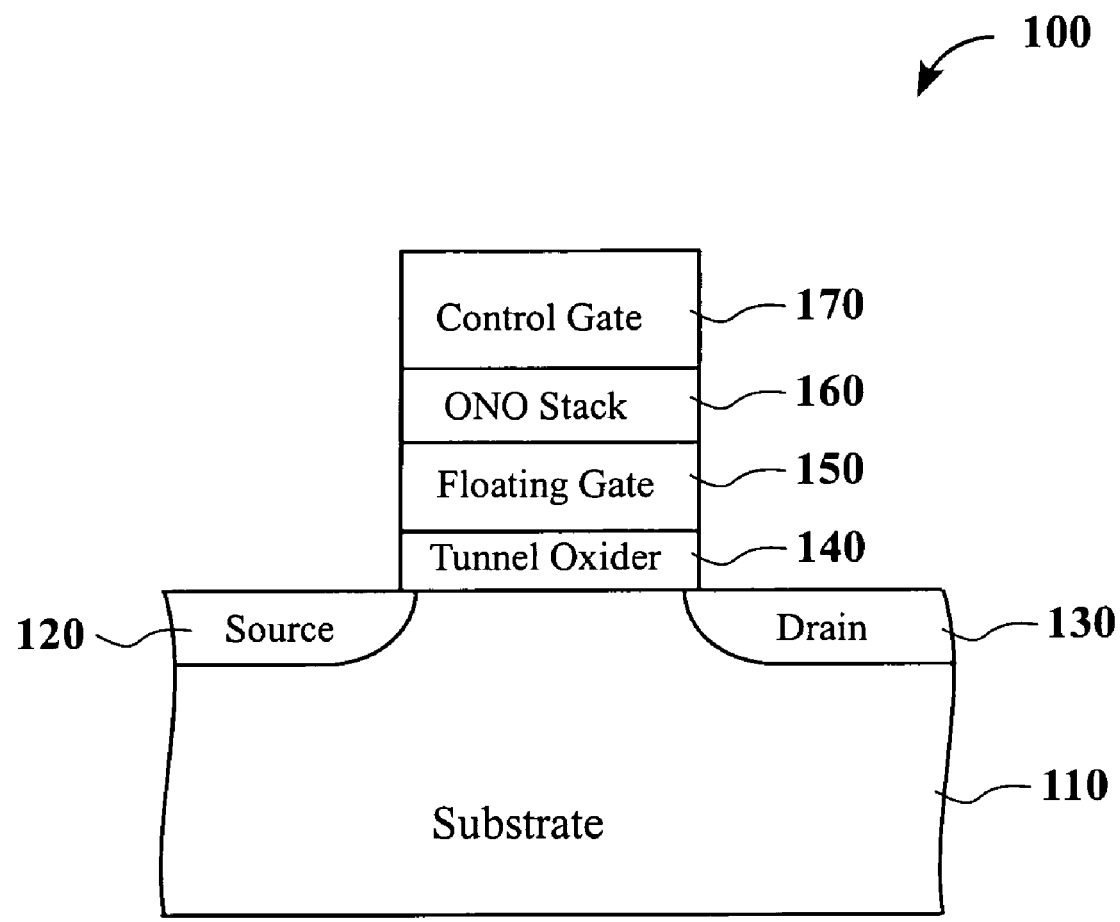
FIG. 1 shows a cross-sectional view of a conventional floating gate memory cell.
Figure 2A:
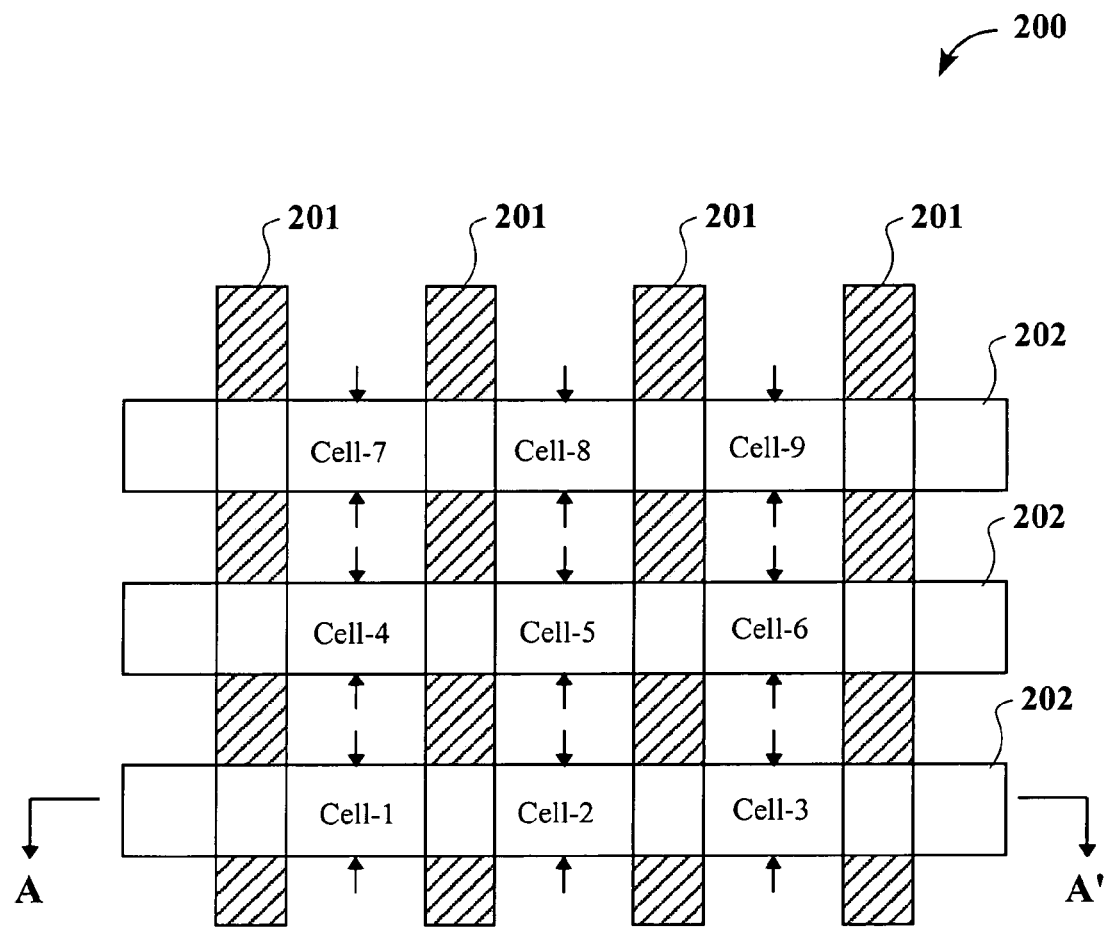
FIG. 2(a) is a top view of a NOR/NAND-type air tunnel floating gate memory array and FIG. 2(b)-(c) are cross-sectional views of the NOR/NAND-type floating gate memory array viewed from the A-A' line before and after the air tunnels of the memory cells of the NOR/NAND-type air tunnel floating gate memory array are formed in accordance with one embodiment of the present invention.
Figure 2B:
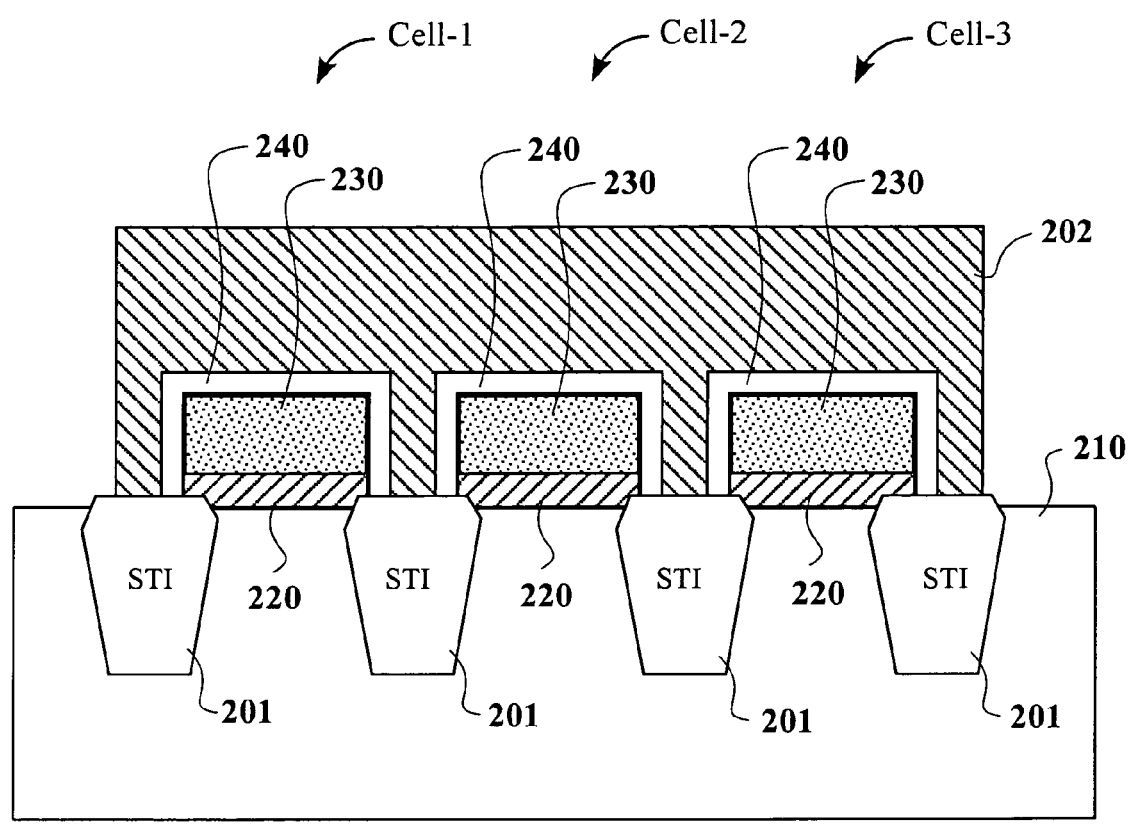
Figure 2C:
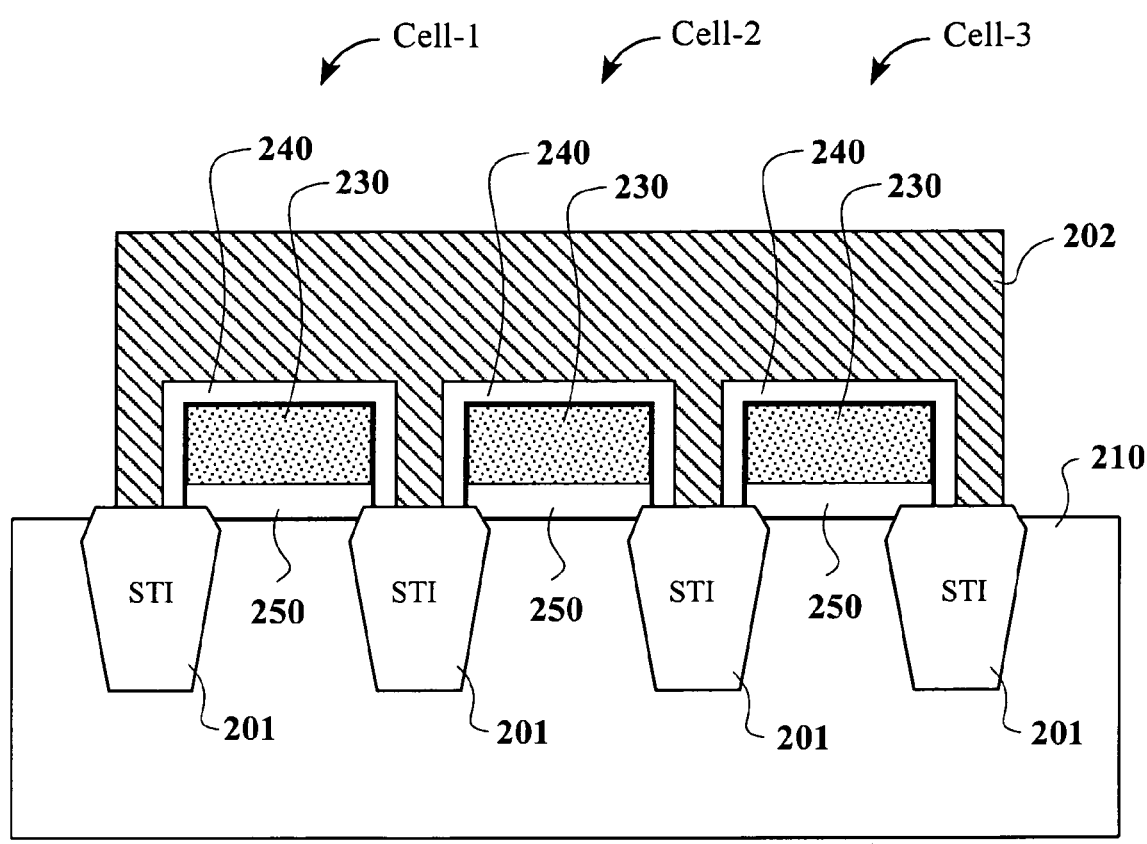

FIG. 2(a) is a top view of a NOR/NAND-type air tunnel floating gate memory array 200 and FIG. 2(b)-(c) are cross-sectional views of the NOR/NAND-type floating gate memory array 200 viewed from the A-A' line before and after the air tunnels of the memory cells of the NOR/NAND-type air tunnel floating gate memory array 200 are formed in accordance with one embodiment of the present invention.

As shown in FIG. 2(*a*), the NOR/NAND-type floating memory array 200 includes 9 memory cells (cell_1, cell_2, . . . , and cell_9) with 3 memory cells sharing a word line (WL) 202. Four shallow trench isolation (STI) regions 201 are used to separate the 9 memory cells into 3 columns. The cross-sectional views of the cell_1, cell_2, and cell_3 viewed from the A-A' line before and after the air tunnels of the cell_1, cell_2, and cell_3 are formed are shown in FIG. 2(*b*) and FIG. 2(*c*). In one embodiment, the STI regions are oxide regions.

As shown in FIG. 2(*b*), after four STI regions 201 are formed on a substrate 210, a sacrificial layer 220 is formed between any two STI regions 201 and over the substrate 210. In one embodiment, the sacrificial layer 220 is a nitride layer. In another embodiment, the thickness of the sacrificial layer 220 ranges between about 3 nm to about 10 nm. A first polysilicon layer 230, functioning as a floating gate, is deposited over the sacrificial layer 220. The first polysilicon layer 230 and the sacrificial layer 220 are patterned together. Then, a conformal oxide layer 240 is disposed over the first polysilicon layer 230 such that the conformal oxide layer 240 caps the polysilicon layer 230 and defines the sidewalls of the sacrificial layer 220. A second polysilicon layer 202 is formed over the conformal oxide layer 240. The second polysilicon layer 202 is then patterned to form a word line 202. The conformal oxide layer 240 is also called an inter-poly oxide layer.

Next, a hot phosphoric acid ($H_3PO_4$) dip is used to laterally etch away the sacrificial layer 220 of each memory cell of the NOR/NAND-type floating memory array 200. The lateral etching directions for each memory cell are shown in the FIG. 2(*a*) by arrows. The hot $H_3PO_4$ dip will etch away the sacrificial layer 220 starting from the front wall and the back wall of the sacrificial layer 220. Since the hot $H_3PO_4$ dip is at least 30 times more selective to remove nitride than oxide and silicon, after the sacrificial layer 220 is removed, the geometrical profile of the memory cells of the NOR/NAND-type air tunnel floating gate memory array 200 remains virtually unchanged. As a result, an air tunnel 250, as shown in FIG. 2(*c*), is formed between the substrate 210 and the first polysilicon layer (floating gate) 230 for each memory cell of the NOR/NAND-type floating gate memory array 200. In one embodiment, the thickness of the air tunnel 250 ranges between about 3 nm to about 10 nm. In another embodiment, the air tunnel 250 is a vacuum tunnel after the front wall and back wall of the air tunnel 250 are oxidized.

Figure 3A:
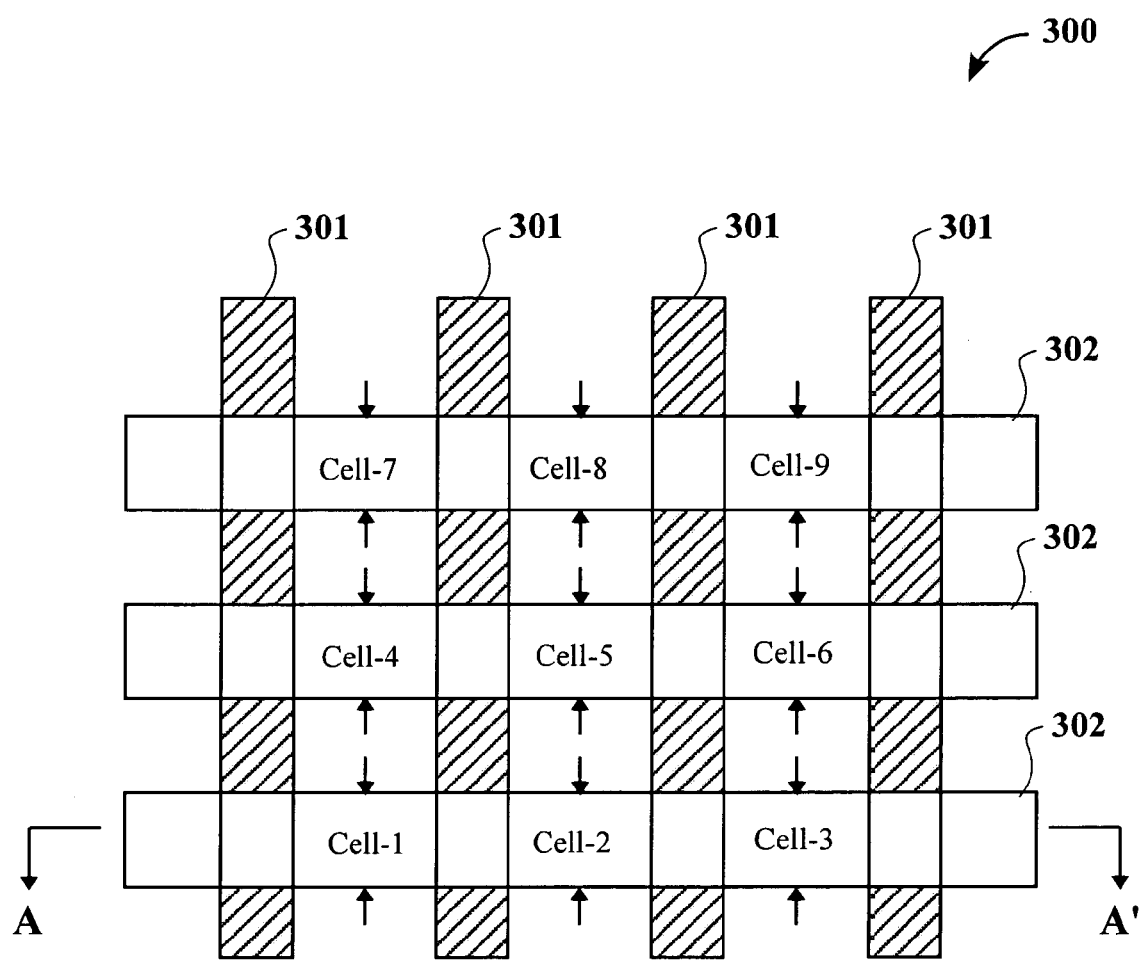
FIG. 3(a) is a top view of an AND-type air tunnel floating gate memory array and FIG. 3(b)-(c) are cross-sectional views of the AND-type air tunnel floating gate memory array viewed from the A-A' line before and after the air tunnels of the memory cells of the AND-type air tunnel floating gate memory array are formed in accordance with one embodiment of the present invention.
Figure 3B:
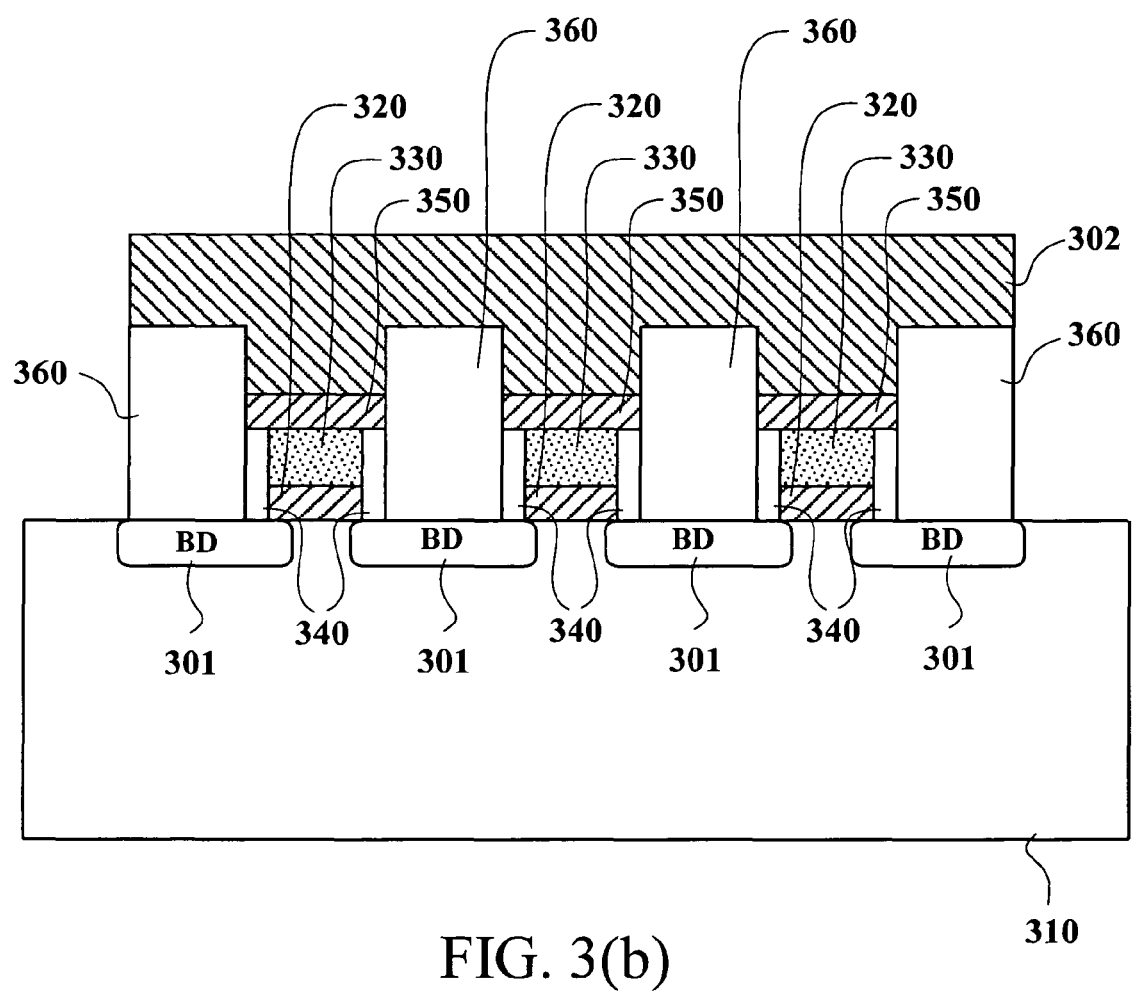
Figure 3C:
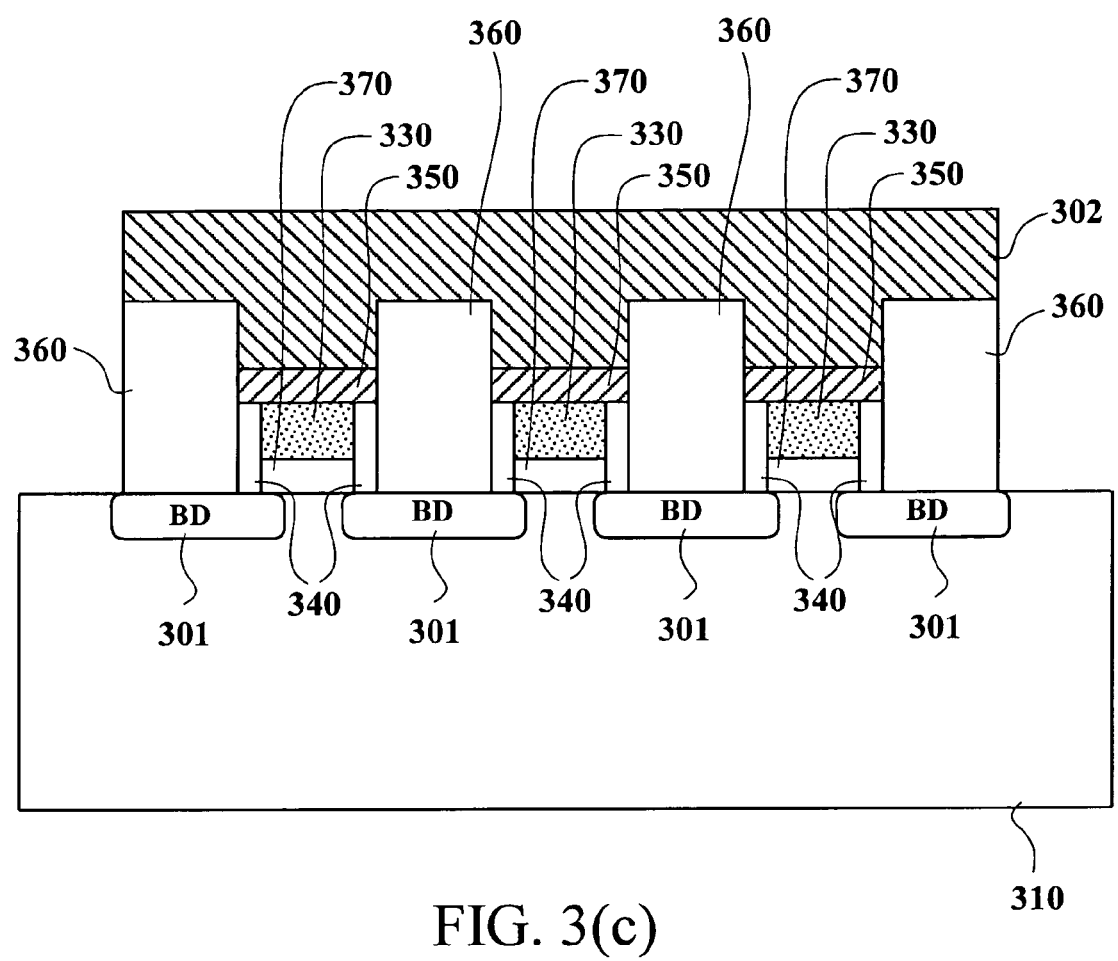

FIG. 3(*a*) is a top view of an AND-type air tunnel floating gate memory array 300 and FIG. 3(*b*)-(*c*) are cross-sectional views of the AND-type air tunnel floating gate memory array 300 viewed from the A-A' line before and after the air tunnels of the memory cells of the AND-type air tunnel floating gate memory array 300 are formed in accordance with one embodiment of the present invention.

As shown in FIG. 3(*a*), the AND-type air tunnel floating gate memory array 300 includes 9 memory cells (cell_1, cell_2, . . . , and cell_9) with 3 memory cells sharing a word line (WL) 302. The cross-sectional views of the cell_1, cell_2, and cell_3 viewed from the A-A' line before and after the air tunnels of the cell_1, cell_2, and cell_3 are formed are shown in FIG. 3(*b*) and FIG. 3(*c*).

As shown in FIG. 3(*b*), after four buried diffusion (BD) regions 301 are formed on a substrate 310, a sacrificial layer 320 is formed between any two BD regions 301 and over the substrate 310. In one embodiment, the sacrificial layer 320 is a nitride layer. In another embodiment, the thickness of the sacrificial layer 320 ranges between about 3 nm to about 10 nm. A first polysilicon layer 330, functioning as a floating gate, is deposited over the sacrificial layer 320. After the first polysilicon layer 330 and the sacrificial layer 320 are patterned together, the sidewalls of the first polysilicon layer 330 and the sacrificial layer 320 are oxidized to form two oxide spacers 340 for each memory cell. A high-density plasma (HDP) oxide region 360 is formed over each BD region to isolate each memory cell. Next, an oxide layer 350, i.e., an inter-poly oxide layer, is disposed between two HDP oxide regions 360 and over the first polysilicon layer 330 and the oxide spaces 340. A second polysilicon layer 302 is formed over HDP oxide regions 360 and the oxide layers 350. The second polysilicon layer 202 is then patterned to form a word line 302.

A hot $H_3PO_4$ dip is then used to laterally etch away the sacrificial layer 320. As shown by arrows in FIG. 3(*a*), the hot $H_3PO_4$ dip will etch away the sacrificial layer 320 of each memory cell of the AND-type air tunnel floating gate memory array 300 starting from the front wall and back wall of each sacrificial layer 320. Because the hot $H_3PO_4$ dip is at least 30 times more selective to remove the nitride than oxide and silicon, after the sacrificial layer 320 is removed, the geometrical profile of the memory cells of the AND-type air tunnel floating gate memory array 300 remains virtually unchanged. As a result, as shown in FIG. 3(*c*), an air tunnel 370 is formed between the substrate 310 and the first polysilicon layer (floating gate) 330 for each memory cell of the AND-type air tunnel floating gate memory array 300.

Figure 4:
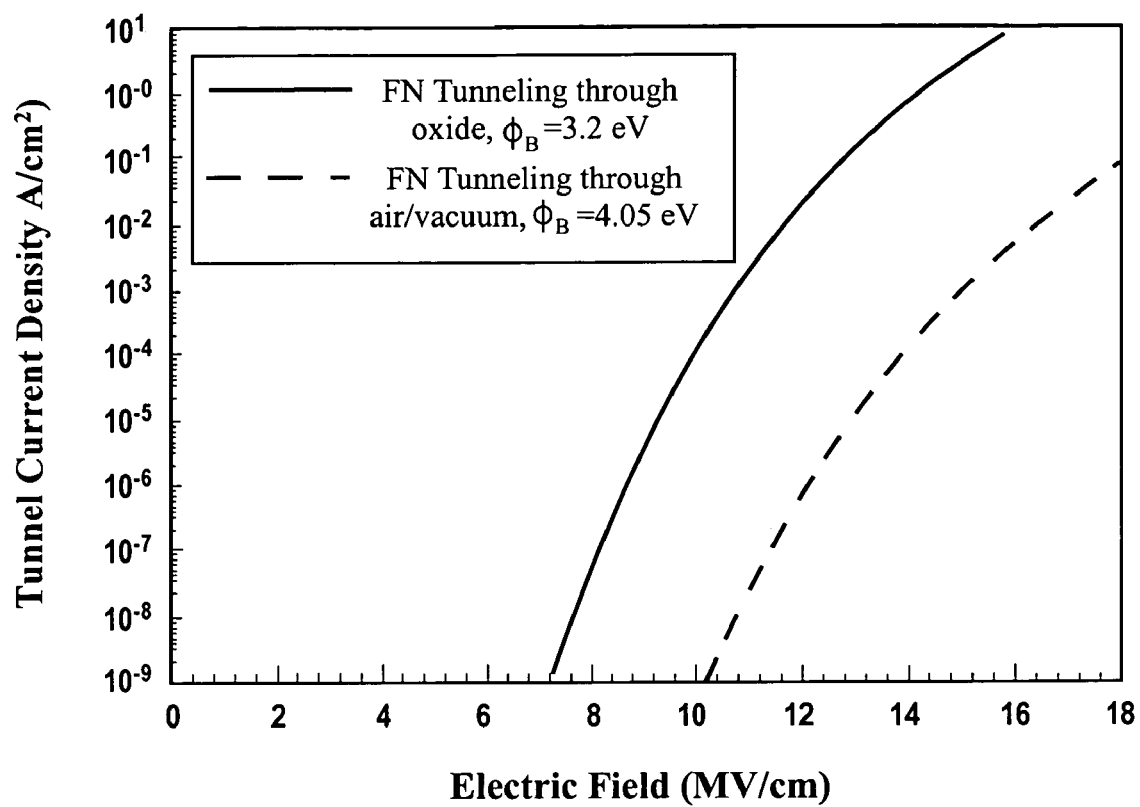
FIG. 4 is a graph showing the simulated Fowler-Nordheim (FN) tunneling current density as a function of the electric field for a conventional floating gate memory cell and an air tunnel floating gate memory cell in accordance with one embodiment of the present invention.

FIG. 4 is a graph showing the simulated Fowler-Nordheim (FN) tunneling current density as a function of the electric field for a conventional floating gate memory cell and an air tunnel floating gate memory cell in accordance with one embodiment of the present invention. The electron barrier height of the FN tunneling through the tunnel oxide layer of a conventional floating gate memory cell is 3.2 eV, whereas the electron barrier height of the FN tunneling through the air tunnel of an air tunnel floating gate memory cell is 4.05 eV that corresponds to the electron affinity of silicon.

As shown in FIG. 4, the FN tunneling current density curve (represented by the dashed line) for the air tunnel floating gate memory cell is lagged about 3 MV/cm behind the one for the conventional floating gate memory cell. The suitable FN tunneling operational electric field for the tunnel oxide layer of the conventional floating gate memory cell is about 9 to 12 MV/cm. In order to provide the same FN tunneling current density for the air tunnel floating gate memory cell, the FN tunneling operational electric field for the air tunnel of the air tunnel floating gate memory cell needs to be about 12 to 15 MV/cm.

Because the dielectric constant of air is only 1 and the dielectric constant of oxide is 3.9, the electric field applied to the air tunnel floating gate memory cell will drop mostly at the air tunnel. Even when the area ratio of the inter-poly oxide layer and the air tunnel is 1, the electric field in the air tunnel is about 3.9 times of the inter-poly oxide layer. Therefore, although the air tunnel floating gate memory cell is stressed at higher electric field (about 12 to 15 MV/cm), the electric field dropped at the inter-poly oxide layer is only about 4 MV/cm that will not cause the degradation of the inter-poly oxide layer. High electric field will not incur any damages to the air tunnel of the air tunnel floating gate memory cell. If the area ratio of the inter-poly oxide layer and the air tunnel is further raised (the gate coupling ratio can be easily raised over 0.7), the high gate coupling ratio can provide low gate voltage operation with high speed.

Figure 5A:
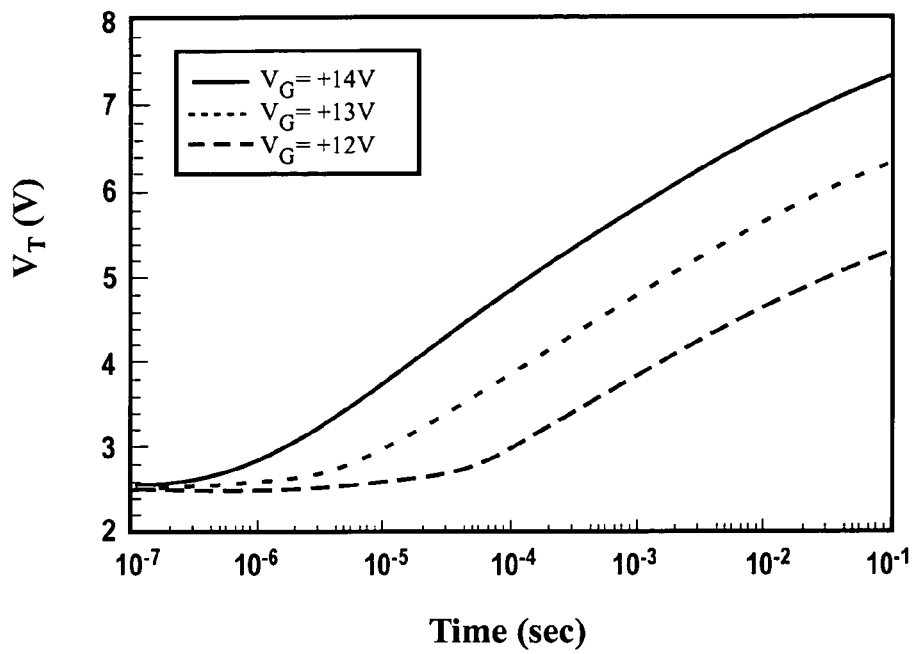
FIG. 5(a)-(b) are graphs showing the FN tunneling programming and the FN tunneling erasing characteristics of an air tunnel floating gate memory cell in accordance with one embodiment of the present invention.
Figure 5B:
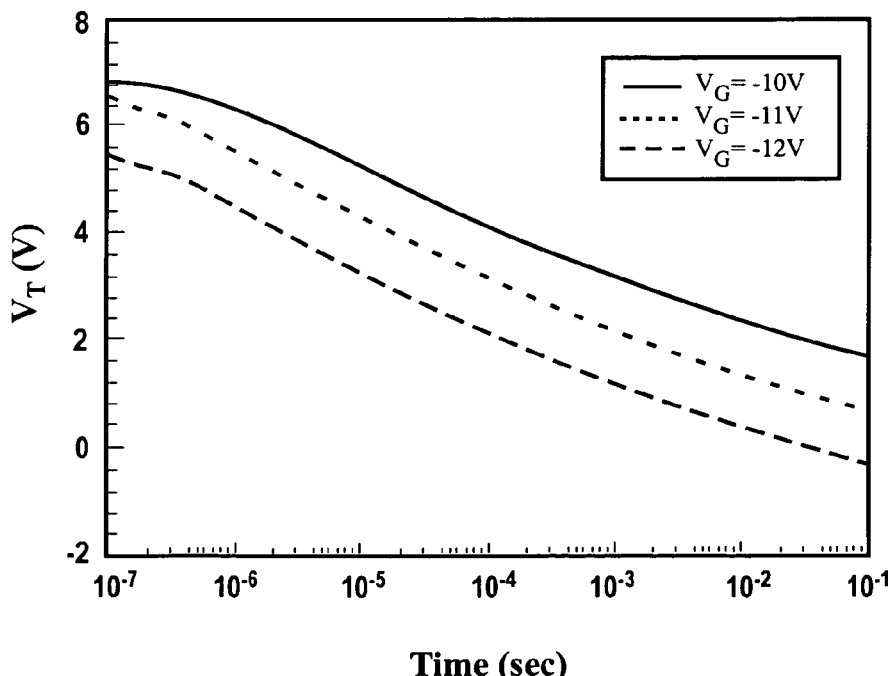

FIG. 5(a)-(b) are graphs showing the FN tunneling programming and the FN tunneling erasing characteristics of an air tunnel floating gate memory cell in accordance with one embodiment of the present invention. The air tunnel floating gate memory cell used to plot those two graphs has an area ratio of 1 between the areas of its inter-poly oxide layer and the air tunnel. The thickness of the air tunnel of this air tunnel floating gate memory cell is 5 nm and the thickness of its inter-poly oxide layer is 10 nm. The FN tunneling characteristics is independent of the n-channel or p-channel air tunnel floating gate memory cell.

The high electrical field applied to the air tunnel of the air tunnel floating gate memory cell makes its FN tunneling speed fast enough for a medium gate voltage $V_G$ operation. As shown in FIG. 5(a)-(b), when the gate voltage $V_G \leq 14V$, the FN tunneling programming speed and the FN tunneling erasing speed are already very fast. However, to achieve the same FN programming and FN erasing speeds for a conventional floating gate memory cell, the gate voltage needs to be at least 18V that might cause damage to the tunnel oxide layer of the conventional floating gate memory cell.

If a higher gate voltage is applied to an air tunnel floating gate memory cell, much higher program/erase speed can be achieved without the conventional tunnel oxide layer damages of a conventional floating gate memory cell. As mentioned above, the applied higher gate voltage will drop mostly at the air tunnel rather than at the inter-poly oxide layer. Even when the area ratio of the inter-poly oxide layer and the air tunnel is 1, the electric field in the air tunnel is about 3.9 times of the inter-poly oxide layer. If the area ratio of the inter-poly oxide layer and the air tunnel is further raised (the gate coupling ratio can be easily raised over 0.7), the high gate coupling ratio can provide low gate voltage operation with high speed.

In one embodiment, the channel hot electron (CHE) injection can be used to program an air tunnel floating gate memory cell. For example, a large positive gate voltage ($V_G$=10V) and drain voltage ($V_D$=5V) can be applied to an air tunnel floating gate memory cell to induce hot electron injections at the drain side. Other hot election injection programming methods such as channel initialed secondary electron injection (CHISEL) and pulse agitated substrate high electron injection (PASHEI) can also be possibly used to program an air tunnel floating gate memory cell. However, due to the large electron barrier height of the air tunnel (4.05 eV), the CHE injection efficiency for an air tunnel floating gate memory cell is lower as compared with the one for a conventional floating gate memory cell. The large electron barrier height of the air tunnel also causes the effect of the band-to-band tunneling hot hole injection (BTBTHH) to be negligible. Thus, the source side or drain side FN tunneling at the junction overlap region can be adopted without inducing the hot-hole injection. The drain side or the source side FN tunneling can be adopted for the memory cells in a NOR/AND air tunnel floating gate memory array.

One feature of the disclosed air tunnel floating gate memory cell is that it can be easily implemented in the current NOR/NAND/AND-type floating gate memory arrays. Another feature of the air tunnel floating gate memory cell is that it has intrinsic high gate coupling ratio due to the dielectric constant ratio of the air and oxide, which leads to a low gate voltage operation with high tunneling speed. Yet another feature of the air tunnel floating gate memory cell is that its air tunnel is completely free of the stress-induced leakage current (SILC) and the tunnel oxide layer degradation problems of a conventional floating gate memory cell. Hence, the charge retention ability of the air tunnel floating gate memory cell is greatly improved. Because the air tunnel is free of SILC, much thinner air tunnel can be implemented to scale down an air tunnel floating gate memory cell. The thickness of the air tunnel of an air tunnel floating gate memory cell can be as thin as about 3 nm, which is the boundary of direct tunneling. In addition, thin air tunnel of an air tunnel floating gate memory cell will not cause any plasma or spark during electron tunneling because the thickness of the air tunnel is much smaller than the dark space of plasma. There will be no difference whether the air tunnel is an air or vacuum tunnel.

Thus, the air tunnel floating gate memory cell can provide high endurance, low gate voltage operation, and high program/erase speed. Meanwhile, the reliability of an air tunnel floating gate memory cell is guaranteed because the air tunnel is completely free of SILC. The air tunnel floating gate memory cell is expected to have nearly unlimited endurance.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modification s according to the particular purpose contemplated. The scope of the invention is intended to be defined by the claims appended hereto and their equivalents.

What is claimed is:

1. A floating gate memory cell, comprising:
a substrate;
an air tunnel defined over and contacting the substrate and a buried diffusion region therein;
a first polysilicon layer defined over the air tunnel;
a dielectric layer defined over the first polysilicon layer such that the dielectric layer caps the first polysilicon layer and defines sidewalls of the air tunnel; and
an oxide region formed on and contacting the buried diffusion region to isolate each said floating gate memory cell, wherein the oxide region is higher than the dielectric layer and is not covered by the dielectric layer, and the oxide regions and the buried diffusion regions are between adjacent first polysilicon layers of adjacent floating gate memory cells.

2. The floating gate memory cell as recited in claim 1, further comprising a second polysilicon layer defined over the dielectric layer.

3. The floating gate memory cell as recited in claim 1, wherein the air tunnel is a vacuum tunnel.

4. The floating gate memory cell as recited in claim 1, wherein the first polysilicon layer functions as a floating gate.

5. The floating gate memory cell as recited in claim 2, wherein the second polysilicon layer functions as a word line.

6. The floating gate memory cell as recited in claim 1, wherein the floating gate memory cell can be programmed or erased by Fowler-Nordheim (FN) tunneling.

7. The floating gate memory cell as recited in claim 1, wherein the floating gate memory cell can be programmed by channel hot electron (CHE) injection.

8. The floating gate memory cell as recited in claim 1, wherein the floating gate memory cell can be programmed by channel initialed secondary electron injection (CHISEL).

9. The floating gate memory cell as recited in claim 1, wherein the floating gate memory cell can be programmed by pulse agitated substrate high electron injection (PASHEI).

10. The floating gate memory cell as recited in claim 1, wherein the first polysilicon layer and the dielectric layer only contact the side wall of the oxide region.

* * * * *